US008987181B2

(12) United States Patent
Pollard et al.

(10) Patent No.: US 8,987,181 B2
(45) Date of Patent: Mar. 24, 2015

(54) PHOTORESIST AND POST ETCH RESIDUE CLEANING SOLUTION

(71) Applicant: Dynaloy, LLC, Kingsport, TN (US)

(72) Inventors: Kimberly Dona Pollard, Anderson, IN (US); Donald Pfettscher, Brownsburg, IN (US); Meagan Hatfield, Indianapolis, IN (US); Spencer Erich Hochstetler, Kingsport, TN (US); Nichelle M. Wheeler, Fishers, IN (US); Michael T. Phenis, Markleville, IN (US)

(73) Assignee: Dynaloy, LLC, Kingsport, TN (US)

( * ) Notice: Subject to any disclaimer, the term of this patent is extended or adjusted under 35 U.S.C. 154(b) by 95 days.

(21) Appl. No.: 13/651,790

(22) Filed: Oct. 15, 2012

(65) Prior Publication Data

US 2013/0116159 A1  May 9, 2013

Related U.S. Application Data

(60) Provisional application No. 61/557,229, filed on Nov. 8, 2011.

(51) Int. Cl.
 *C11D 1/72* (2006.01)
 *C11D 3/04* (2006.01)
 *C11D 3/20* (2006.01)
 *C11D 3/30* (2006.01)
 *C11D 3/44* (2006.01)
 *C11D 3/43* (2006.01)
 *C11D 3/34* (2006.01)
 *C11D 11/00* (2006.01)
 *G03F 7/42* (2006.01)

(52) U.S. Cl.
 CPC .. *C11D 1/72* (2013.01); *C11D 3/43* (2013.01); *C11D 3/2024* (2013.01); *C11D 3/044* (2013.01); *C11D 3/2068* (2013.01); *C11D 3/30* (2013.01); *C11D 3/3445* (2013.01); *C11D 11/0047* (2013.01); *G03F 7/426* (2013.01); *G03F 7/425* (2013.01)
 USPC ........... 510/176; 510/175; 510/245; 510/254; 510/264; 510/274; 510/499; 510/505; 510/506; 510/493

(58) Field of Classification Search
 CPC ........ C11D 1/72; C11D 3/044; C11D 3/2024; C11D 3/2068; C11D 3/30; C11D 3/3445; C11D 3/43
 USPC ......... 510/175, 176, 245, 254, 264, 274, 499, 510/505, 506, 493
 See application file for complete search history.

(56) References Cited

U.S. PATENT DOCUMENTS

| 3,873,668 | A | 3/1975 | Melby |
| 3,888,891 | A | 6/1975 | Smith et al. |
| 3,920,695 | A | 11/1975 | Smith et al. |
| 3,963,744 | A | 6/1976 | Smith et al. |
| 3,981,859 | A | 9/1976 | Smith et al. |
| 4,038,293 | A | 7/1977 | Smith et al. |
| 4,518,675 | A | 5/1985 | Kataoka |
| 4,547,271 | A | 10/1985 | Bharucha et al. |
| 4,830,641 | A | 5/1989 | White, Jr. et al. |
| 5,008,273 | A | 4/1991 | Schnorrenberg et al. |
| 5,139,607 | A | 8/1992 | Ward et al. |
| 5,233,010 | A | 8/1993 | McGhee et al. |
| 5,252,737 | A | 10/1993 | Stern et al. |
| 5,369,189 | A | 11/1994 | Kim et al. |
| 5,453,541 | A | 9/1995 | Stern et al. |
| 5,597,678 | A | 1/1997 | Honda et al. |
| 5,608,111 | A | 3/1997 | Stern et al. |
| 5,612,304 | A | 3/1997 | Honda et al. |
| 5,623,088 | A | 4/1997 | Stern et al. |
| 5,648,324 | A | 7/1997 | Honda et al. |
| 5,795,702 | A | 8/1998 | Tanabe et al. |
| 5,798,323 | A | 8/1998 | Honda et al. |
| 6,033,996 | A | 3/2000 | Rath et al. |
| 6,063,522 | A | 5/2000 | Hamrock et al. |
| 6,137,010 | A | 10/2000 | Joo et al. |
| 6,200,891 | B1 | 3/2001 | Jagannathan et al. |
| 6,319,835 | B1 | 11/2001 | Sahbari et al. |
| 6,372,410 | B1 | 4/2002 | Ikemoto et al. |
| 6,399,273 | B1 | 6/2002 | Yamada et al. |

(Continued)

FOREIGN PATENT DOCUMENTS

| JP | 07-28254 A | 1/1995 |
| JP | 2001-312074 A | 11/2001 |

(Continued)

OTHER PUBLICATIONS

Ecosurf EH Specialty Surfactants, Fast Wetting, Low Odor, Biodegradable Surfactants, Jan. 2009.*
Air Products—Tomadol Ethoxylated Alcohols, 2010.*
Dow—Triton X-45, 1995.*
Optimal Group of Companies—Chemical Safety Data Sheet, Feb. 2003.*
Ho et al., Wafer-Scale, Sub-5 nm Junction Formation by Monolayer Doping and Conventional Spike Annealing, Nano Letters, 2009, vol. 9, No. 2, pp. 725-730, entire document, especially: p. 726, col. 1, para. 2.
Ho et al., Controlled Nanoscale Doping of Semiconductors via Molecular Monolayers, Nature Materials, vol. 7, Jan. 2008, pp. 62-67, entire document.
Notification of Transmittal of the International Search Report dated Feb. 21, 2008 for corresponding PCT/US2007/066128.

(Continued)

*Primary Examiner* — Gregory R Delcotto
(74) *Attorney, Agent, or Firm* — Dennis V. Carmen

(57) ABSTRACT

A photoresist and post etch cleaning solution for semiconductor wafers comprising:
  A. a polar aprotic solvent,
  B. an inorganic base;
  C. a co-solvent for said inorganic base;
  D. a unsaturated cycloaliphatic compound having a ring ether group and at least one substituent bearing a primary hydroxyl group;
  E. an organic base comprising an amine compound; and
  F. a nonionic surfactant bearing at least one ether group.
The wafer containing photoresist residue or post etch residue can be cleaned by contacting the solution in a spray or immersion.

55 Claims, No Drawings

(56) References Cited

U.S. PATENT DOCUMENTS

| | | | |
|---|---|---|---|
| 6,455,479 | B1 | 9/2002 | Sahbari |
| 6,465,403 | B1 | 10/2002 | Skee |
| 6,531,436 | B1 | 3/2003 | Sahbari et al. |
| 6,566,322 | B1 | 5/2003 | Brook et al. |
| 6,579,668 | B1 | 6/2003 | Baik et al. |
| 6,638,694 | B2 | 10/2003 | Ikemoto et al. |
| 6,683,219 | B2 | 1/2004 | DeLuca et al. |
| 6,797,682 | B2 | 9/2004 | Hara et al. |
| 6,825,156 | B2 | 11/2004 | Lee et al. |
| 6,844,461 | B2 | 1/2005 | DeLuca et al. |
| 6,846,748 | B2 | 1/2005 | Chien et al. |
| 6,872,663 | B1 | 3/2005 | Okada |
| 6,878,500 | B2 | 4/2005 | Rutter, Jr. et al. |
| 6,911,293 | B2 | 6/2005 | Wanat et al. |
| 6,916,772 | B2 | 7/2005 | Zhou et al. |
| 7,049,275 | B2 | 5/2006 | Ikemoto et al. |
| 7,064,087 | B1 | 6/2006 | Turner et al. |
| 7,078,371 | B2 | 7/2006 | Ikemoto |
| 7,157,605 | B2 | 1/2007 | Kim et al. |
| 7,166,362 | B2 | 1/2007 | Kano |
| 7,528,098 | B2 | 5/2009 | Lee et al. |
| 7,615,377 | B2 | 11/2009 | Lippard et al. |
| 7,674,755 | B2 | 3/2010 | Egbe et al. |
| 7,922,823 | B2 | 4/2011 | Walker et al. |
| 7,960,328 | B2 | 6/2011 | Visintin et al. |
| 8,093,150 | B2 | 1/2012 | Beck et al. |
| 8,192,923 | B2 | 6/2012 | Yokoi et al. |
| 8,263,539 | B2 | 9/2012 | Phenis et al. |
| 2001/0014534 | A1 | 8/2001 | Aoki et al. |
| 2002/0037819 | A1 | 3/2002 | Sahbari |
| 2003/0138737 | A1 | 7/2003 | Wakiya et al. |
| 2004/0038840 | A1 | 2/2004 | Lee et al. |
| 2004/0081922 | A1 | 4/2004 | Ikemoto et al. |
| 2004/0106532 | A1 | 6/2004 | Yokoi et al. |
| 2004/0256358 | A1 | 12/2004 | Shimizu et al. |
| 2004/0266912 | A1 | 12/2004 | Aida et al. |
| 2005/0112769 | A1 | 5/2005 | Lippard et al. |
| 2005/0143365 | A1 | 6/2005 | Kim et al. |
| 2006/0099831 | A1 | 5/2006 | Borovik et al. |
| 2007/0111912 | A1 | 5/2007 | Phenis et al. |
| 2007/0243773 | A1 | 10/2007 | Phenis et al. |
| 2008/0076688 | A1 | 3/2008 | Barnes et al. |
| 2009/0047609 | A1 | 2/2009 | Atkinson et al. |
| 2009/0119979 | A1 | 5/2009 | Mullen |
| 2009/0186793 | A1 | 7/2009 | Phenis et al. |
| 2009/0229633 | A1* | 9/2009 | Kabashima et al. ............ 134/11 |
| 2010/0089426 | A1 | 4/2010 | Phenis et al. |
| 2010/0249181 | A1 | 9/2010 | DeGoey et al. |
| 2010/0298605 | A1 | 11/2010 | Hirose et al. |
| 2010/0304313 | A1* | 12/2010 | Zhang et al. .................. 430/432 |
| 2011/0124187 | A1 | 5/2011 | Afzali-Ardakani et al. |
| 2012/0003826 | A1 | 1/2012 | Pollard et al. |
| 2012/0009762 | A1* | 1/2012 | Tamboli et al. ............... 438/460 |
| 2012/0042898 | A1* | 2/2012 | Visintin et al. .................... 134/2 |

FOREIGN PATENT DOCUMENTS

| | | | |
|---|---|---|---|
| JP | 2003-255565 A | | 9/2003 |
| JP | 2004-093678 A | | 3/2004 |
| JP | 2004-133153 A | | 4/2004 |
| WO | WO2008/039730 | * | 4/2008 |

OTHER PUBLICATIONS

Notification of Transmittal of the International Search Report dated Jun. 5, 2008 for corresponding PCT/US2006/041394.

International Search Report with an International filing date Mar. 8, 2011, International Application No. PCT/US2011/27493.

Notification of Transmittal of the International Search Report and the Written Opinion of the International Searching Authority, or the Declaration, International Application No. PCT/US2012/063154 with a mailing date of Feb. 19, 2013.

* cited by examiner

PHOTORESIST AND POST ETCH RESIDUE CLEANING SOLUTION

1. CROSS-REFERENCES TO RELATED APPLICATIONS

This application claims priority under 35 U.S.C. §119(e) to: U.S. Provisional Application Ser. No. 61/557,229 filed on Nov. 8, 2011.

2. FIELD OF THE INVENTION

The present disclosure relates to a cleaning solution for removing residues from semiconductor substrates, and particularly to remove post etch residues from wafers.

3. BACKGROUND OF THE INVENTION

The technology of fabricating semiconductor integrated circuits has advanced with regard to the number of transistors, capacitors and other electronic devices which can be fabricated on a single integrated circuit chip. This increasing level of integration has resulted in large part from a reduction in the minimum feature sizes of the integrated circuits and an increase in the number of layers and functionality which make up the integrated circuit. The manufacture of integrated circuit components having this reduced size and the need to reduce production steps has placed new demands on all aspects of their production including the removal of resists and related materials with chemical stripper solutions.

Semiconductor devices for semiconductor integrated circuits or liquid crystal displays are commonly produced by a process including the steps of coating a substrate with one or more layers of polymeric resist materials to provide a resist film; patterning the photosensitive resist film by exposure to light and subsequent development; etching exposed portions of the substrate using the patterned resist film as a mask to form minute circuits; and removing the resist film from the inorganic substrate. Alternatively, after forming minute circuits, the post etch residues can be ashed and the remaining resist residues removed from the substrate with a post etch residue remover.

Resist stripping compositions that include aromatic quaternary ammonium hydroxide such as benzyltrimethylammonium hydroxide (BTMAH), a solvent such as an alkylsulfoxide, a glycol and a corrosion inhibitor and non-ionic surfactant do not completely remove many dry-film resists from a wafer surface. Similarly, compositions which use pyrrolidone-based solvents such as N-methylpyrrolidone (NMP) exhibit the same drawback in that they have not achieved complete removal of many dry-film resists and have compatibility problems with the photoresists. In general, compositions which include a quaternary ammonium hydroxide as tetramethylammonium hydroxide (TMAH) in N-methylpyrrolidone are not compatible with cured polyimide layers on the wafer.

The Cu film is adhered to layers underneath typically comprising organic dielectric films using Ti or TiW. Commonly this film is removed also in a dilute acid bath, but may be removed using a high energy plasma process. In addition, it may be beneficial to use a high energy plasma process to remove some of the organic dielectric film for a variety of reasons, including to improve electrical isolation of the solder bumps and/or as part of a plasma dicing process.

During the high energy plasma-based process, it is common for photoresist residues to remain behind. Further, plasma-based decomposition products can remain as post etch residues. Finally, organic or organometallic and metal oxides vaporized from the plasma etching process can sublime onto, or be sputtered onto, or react in the vapor phase with each other and deposit onto, the top of the solder bumps or back onto any of the other features on the semiconductor wafer surface.

In wafer level packaging, solder bumps can be formed using an electroplating process. Electrical contact for the plating step is made using a continuous Cu film to distribute the current across a wafer that is patterned with a photoresist mask. Metal is plated onto the copper surface in open features. After plating, the photoresist mask is removed and the continuous Cu film is etched from around the plated metal using a dilute acid solution to electrically disconnect the solder bumps.

The challenge remains to find a solution which cleans post etch residues, that is, residues created or resulting from an etching process (e.g. an acid and/or plasma etching process) which can include organic materials such as post etch degradation or damaged polyimide, new metal oxides formed such as SnO, and organometallic degradation products created from the plasma etching process such as from etching the Ti layer and/or the Sn etch products (collectively the post etch residues).

It is also desirable that this solution not only clean and remove photoresist post etch residues, but also maintains compatibility with permanent wafer features, such as metals comprising the solder caps (e.g. SnAg) and the copper pillars. A solution which is incompatible with the wafer features can result in further undesirably etching these metal surfaces including the copper pillars and solder bumps, resulting in yield loss.

The solution also should remain stable as a solution during the cleaning process to avoid leaving behind residues. Although solid particulates can form as byproducts in the solution during the heating and cooling cycle or over time, the particulates should remain in solution and not precipitate out of solution. Any precipitate byproducts can remain as deposits on wafer surface and production equipment. Thus, the solution should be stable at elevated temperatures encountered during operation and when cooled back to room temperatures.

This application addresses a composition and a process for removing organic, organometallic, and metal oxides from semiconductor substrates that have their origin as photoresist residues and etching residues on wafer, solder bump walls, and the top surface of the solder bumps.

4. SUMMARY OF THE INVENTION

There is now provided a new cleaning solution which is stable in a heating cooling cycle, while effectively simultaneously cleaning photoresist residues and post etch residues.

There is now provided a solution comprising:
A. a polar aprotic solvent,
B. an inorganic base,
C. a co-solvent for said inorganic base,
D. a unsaturated cycloaliphatic compound having a ring ether group and at least one substituent bearing a primary hydroxyl group,
E. an organic base comprising an amine compound, and
F. a nonionic surfactant bearing at least one ether linkage.

There is also provided a process comprising contacting an etched wafer containing etching residues with a cleaning solution to remove post etch residues, including solder bump residues, from the entire wafer surface without etching metal on the wafer. The cleaning solution used in this process is desirably the cleaning solution formulation noted above.

5. DETAILED DESCRIPTION OF THE INVENTION

The terms "coating" and "deposition" are used interchangeably throughout this specification. The terms "residue" include the photoresist residues before etching an etch residues that include the photoresist byproducts of the etching process, deposits on the solder caps, and other organometallic residues of Ti or Cu etching unless specific reference is made type of residue. The terms "stripping", "removing", and "cleaning" are used interchangeably throughout this specification. Likewise, the terms "stripper" and "cleaning composition" are used interchangeably. The term "coating" is defined as a method for applying a film to a substrate such as spray coating, puddle coating, slit coating or immersing. The indefinite articles "a" and "an" are intended to include both the singular and the plural. All ranges are inclusive and combinable in any order except where it is clear that such numerical ranges are constrained to add up to 100%, and each range includes all the integers within the range. The terms "weight percent" or "wt %" mean weight percent based on the total weight of the solution, unless otherwise indicated.

The solution of the invention is effective to remove post etch residues. The solution of the invention can be used to remove residues, including photoresists, etch residues, and the like in a variety of other standard applications including, but not limited to (i) negative and positive resist removal in wafer level packaging, (ii) post etch residue, including acid and plasma etch residues, for wafer level packaging, plasma dicing, back end of line and for front end of line applications, (iii) plasma dicing operations and (iv) rework.

The solution of the invention is effective to clean residues from a substrate, for example, an electronic device substrate such as a wafer, which may exhibit irregular topography that includes various layers and structures such as metal, semiconductor, dielectric and polymeric materials. Typical semiconductor wafer materials include, for example, materials such as silicon, gallium arsenide, indium phosphide, sapphire materials, as well as glass and ceramic.

The compositions and methods have particular applicability to semiconductor wafer fabrication, for example, in the removal of organic films and residues from semiconductor wafers. Such organic substances are present, for example, on post-etched wafers during front-end processing or in back-end wafer-level-packaging during a wafer bumping process. The compositions and methods are particularly suitable for the removal from wafers of hard-to-remove materials such as dry film photoresists and post etch residues.

While the present invention provides stripping compositions and methods which can effectively remove polymeric organic substances from a substrate, it is also adapted for removing photoresists that include positive-tone of both novolac (i.e. cresol formaldehyde) and polyhydroxy styrene (Phost), negative-tone varieties to include acrylics, isoprene (i.e. rubber), as well as dielectrics to include polyimide, polybenzoxazole (PBO), and bisbenzocyclobutene (BCB) but be compatible with cured polyimides, polybenzoxazole (PBO), and bisbenzocyclobutene (BCB). The stripping compositions and methods can also remove other photoresists, for example multi-layer photoresists and chemically amplified photoresists. These organic substances are employed in the fabrication of substrates, for example, the electronic devices on substrates such as wafers or flat panel displays, which may include various layers and structures such as metal, semiconductor, and the associated organic materials.

The solution of the invention is effective even at cleaning the difficult to remove uncured polyimide resist material while being compatible with cured polyimide.

The solution of the invention preferably has a flash point above the operational temperature used to clean the wafer. The solution of the invention can have a flash point that is at least 75° C., or at least 80° C., or at least 85° C., or at least 90° C.

The solution viscosity should be low to permit easy rinsability of the solution from the wafer surface. In one embodiment, the solution viscosity, at 25° C., is less than 20 centipoise (cps), or less than 15 cps, or less than 10 cps, or less than 8 cps, or less than 5 cps, or less than 4 cps, or less than 3 cps, or less than 2 cps, or less than 1.5 cps.

The solution comprises
  A. a polar aprotic solvent,
  B. an inorganic base;
  C. a co-solvent for said inorganic base,
  D. a unsaturated cycloaliphatic compound having a ring ether group and at least one substituent bearing a primary hydroxyl group,
  E. an organic base comprising an amine compound, and
  F. a nonionic surfactant bearing at least one ether group.

A. The Polar Aprotic Solvent

Polar aprotic solvent compounds are known by those of skill. They are characterized as polar, do not have a readily dissociable $H^+$ or an acidic hydrogen, do not display hydrogen bonding, and are able to stabilize ions.

The polar aprotic solvent can comprise a $C_1$-$C_{16}$ dialkyl sulfoxide, or a $C_1$-$C_8$ dialkyl sulfoxide, or a $C_1$-$C_4$ dialkyl sulfoxide, or a $C_1$-$C_2$ dialkyl sulfoxide, or dimethyl sulfoxide. The dialkyl sulfoxides, and especially DMSO, are desirable because they effectively penetrate into the uncured photoresist and are compatible with the cured polyimide photoresist that are intended to remain on the semiconductor wafer. Further, a fluorinated plasma etching tends to damage the underlying cured polyimide layer on the wafer. These post plasma etch damaged cured polyimide layers are less susceptible to attack and further dissolution when using dialkyl sulfoxides such as DMSO when in combination with the inorganic base such as KOH.

In one embodiment, the solution contains less than 8 weight percent compounds containing pyrrolidone moieties, or less than 3 wt. %, or has no compounds added that contain pyrrolidone moieties. Such compounds can have a tendency to gel the solution upon cooling after heating to 93° C.

The aprotic polar solvent is present in an amount of at least 60 wt. %, or at least 65 wt. %, or at least 65 wt. %, or at least 70 wt. %, or at least 73 wt. %, or at least 75 wt. %, or at least 78 wt. %, or at least 80 wt. %, or at least 83 wt. %, or at least 85 wt. %, and up to 95 wt. %, or up to 93 wt. %, or up to 90 wt. %, or up to 87 wt. %, or up to 85 wt. %.

In another embodiment, the polar aprotic solvent is a type present in an amount in the solution effective to remove:
  (i) uncured polyimide photoresist from a semiconductor wafer and
  (ii) polyimide polymer residues on the semiconductor wafer that have been subjected to a plasma etching process, at one or more temperatures within a range of 75° C. to 90° C. and within 150 minutes, or even within 90 minutes, or even within 60 minutes, when immersed in the solution. Examples of such polar aprotic solvents include the dialkyl sulfoxides, in combination with the other ingredients of the solution of the invention, are effective at accomplishing these objectives.

B. The Inorganic Base

The inorganic base is reactive with the photoresist and/or post etch residues and aids in its removal along with the aprotic polar solvent. It is believed that the inorganic base breaks down the molecular weight of the photoresist and/or post etch residues. Organic residues on the semiconductor wafer are often crosslinked when a plasma etching process is applied and therefore difficult to remove. The inorganic base assists in the removal of photoresist and the residues generated from a plasma etching process or other etching processes leaving organic or organometallic post etch residues.

The type and amount of the inorganic base should be determined on the basis of its ability to clean, go into solution, and remain in solution under a heating/cooling cycle.

Suitable inorganic bases comprise the hydroxides of a Group I or Group II metal. For solubility reasons, Group 1 metals are preferred. Examples of the alkali bases that can be mentioned are potassium hydroxide, sodium hydroxide, cesium hydroxide, rubidium hydroxide, and for the alkaline earth bases barium hydroxide, calcium hydroxide, strontium hydroxide, and magnesium hydroxide. Of these, potassium hydroxide is preferred for its solubility going into solution, stable in solution, and ability to clean without leaving residues of potassium.

The solution of the invention desirably does not precipitate solids containing the metal of the inorganic base upon heating with slow agitation to 93° C. for 2 hours and allowed to cool down under ambient conditions to 23° C. The amount of the inorganic base used should be adjusted to effectively clean the wafer while maintaining a stable solution.

In another embodiment, the inorganic base selected is a compound that removes an uncured polyimide layer on a semiconductor wafer within 150 minutes, or within 90 minutes, or within 60 minutes at one or more temperatures within a range of 75° C. to 90° C.

Suitable amounts of inorganic base in the solution are at least 0.5 wt. %, or at least 0.7 wt. %, or at least 0.9 wt. %, or at least 1.0 wt. %, or greater than 1.0 wt. %, or at least 1.1 wt. %, or at least 1.2 wt. %, or at least 1.3 wt. %, or at least 1.4 wt. %, or at least 1.5 wt. %, and up to 3.0 wt. %, or up to 2.5 wt. %, or up to 2.4 wt. %, or up to 2.3 wt. %, or up to 2.2 wt. %, or up to 2.1 wt. %, or up to 2.0 wt. %, or up to 1.9 wt. %, or up to 1.8 wt. %, or up to 1.7 wt. %, or up to 1.6 wt. %, or up to 1.5 wt. %.

In the case of using KOH, it is desirable to use at least 1.0 wt. %. It has surprisingly been found that in a heat/cycle test, a solution containing less than 1.0 wt. % was not stable and precipitated out of solution.

In another embodiment, the solution does not contain added lithium hydroxide for solubility reasons.

C. The Co-Solvent

The co-solvent solvates the inorganic base in the polar aprotic solvent at 25° C. Without this co-solvent, the inorganic base precipitates out of solution over time or in heat/cool cycles. The co-solvent and amount selected is also compatible with cured polyimides so as not to remove the polyimide that should remain on the wafer. Further, the co-solvent type and amount should have the capacity to effectively clean copper sidewalls, be rinseable, not etch the metal, and not leave behind any deposits.

The co-solvent comprises a glycol ether compound having at least one ether linkage and at least one hydroxyl group. Desirably, the co-solvent has one or two ether linkages, and one or two hydroxyl group. An example includes a glycol ether that has one ether linkage and one hydroxyl group. The hydroxyl group can be a secondary or primary, and desirably has a primary hydroxyl group.

In one embodiment, the co-solvent has a molecular weight of less than 500, or less than 400, or less than 300, or less than 250, or up to 200, or up to 190, or up to 180, or up to 160.

Examples of co-solvents that have an ether group and a hydroxyl group can be represented by any one of the following structures:

  (II)

  (III)

  (IV)

  (V)

  (VI)

  (VII)

  (VIII)

wherein $R^4$, $R^{4'}$, $R^5$, $R^{5'}$, $R^6$, $R^7$, $R^8$, $R^9$, $R^{10}$, and $R^{11}$ are independently selected from $C_1$-$C_{14}$ alkyl groups, or $C_1$ to $C_8$ alkyl groups.

Examples of co-solvent within formulae (II)-(VIII) include ethyleneglycol monomethyl ether, ethyleneglycol monoethyl ether, propylene glycol monomethyl ether, diethylene glycol monomethyl ether, diethylene glycol monoethyl ether, diethylene glycol monopropyl ether, diethylene glycol monobutyl ether, dipropylene glycol monobutyl ether, dipropylene glycol monopropyl ether, tripropylene glycol monomethyl ether, tripropylene glycol monobutyl ether, propyleneglycol butyl ether, ethylene glycol monohexyl ether, ethyleneglycol mono-2-ethylbuyl ether, triethyleneglycol monobutyl ether, tetraethyleneglycol monobutyl ether, or tetrapropyleneglycol monobutyl ether, or combinations thereof.

In another embodiment, the co-solvent comprises a compound represented by the following formula (IX):

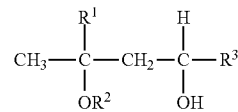

wherein $R^1$ and $R^3$ are each independently be a hydrogen atom or a $C_1$-$C_{12}$ alkyl group, or a $C_1$-$C_8$ alkyl group, or a $C_1$-$C_6$ alkyl group, or a $C_1$-$C_4$ alkyl group, or a $C_1$-$C_2$ alkyl group, and $R^2$ is a $C_1$-$C_{12}$ alkyl group, or a $C_1$-$C_8$ alkyl group, or a $C_1$-$C_6$ alkyl group, or a $C_1$-$C_4$ alkyl group, or a $C_1$-$C_2$ alkyl group. For example, $R^1$ can be a $C_1$-$C_4$ alkyl group, or a $C_1$-$C_2$ alkyl group, $R^3$ can be hydrogen, and $R^2$ can be a $C_1$-$C_4$ alkyl group, or a $C_1$-$C_2$ alkyl group.

Examples of co-solvents within formula (IX) include 3-methoxybutanol; 3-methyl-3-methoxybutanol; and 3-methyl-1,3-butanediol, and combinations thereof.

In another embodiment, the co-solvent can be represented by the following general formula (I):

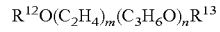

wherein $R^{12}$ and $R^{13}$ each individually are a hydrogen atom or an alkyl group having 1-8 carbon atoms, provided that $R^{12}$ and $R^{13}$ are not both hydrogen atoms, m and n stand individually and independently for an integer of 0-10 provided that m plus n does not equal zero. Desirably, n equals zero, and m is an integer between from 1 to 8, or 1 to 6, or 1 to 4, or 1 to 3, or 1 to 2, and $R^{13}$ is hydrogen. The polymer can be a random or block copolymer.

The co-solvent is present can be present in the solution in an amount of up to 15 wt. %, or up to 10 wt. %, or up to 8 wt. %, or up to 7 wt. %, or up to 6 wt. %, and at least 1 wt. %, or at least 2 wt. %, or at least 3 wt. %, or at least 4 wt. %. The particular amount selected for a given co-solvent should be effective to solubilize the inorganic base while providing a clean surface finish on copper sidewalls.

Care is taken to balance the amount of the co-solvent with the amount of the inorganic base to avoid the precipitating solids from solution and to avoid an excess of co-solvent which can inhibit cleaning. The inorganic base can react with the co-solvent at the primary hydroxyl site to form a salt of the co-solvent, and if a large excess of each are present in solution, the solution becomes unstable and may precipitate upon cooling. Therefore, the amount of co-solvent and inorganic base selected are effective to avoid precipitating solids when subjected to a test comprising heating with slow agitation to 93° C. for 2 hours and cooled to 23° C. under ambient conditions.

D. The Unsaturated Cycloaliphatic Compound

The solution also contains an unsaturated cycloaliphatic compound having an ether group in the ring and at least one substituent bearing a primary hydroxyl group. This compound desirably does not react with the inorganic base at 93° C. to any significant extent and does not have a tendency to form precipitates. The unsaturated cycloaliphatic compound cleans the top of the solder bumps that contain tin/silver solder. These types of deposits often include metal oxides which can form when plasma etching vaporized metal and the vaporized metal sublime or react with surrounding oxygen onto the tops of the solder bumps. Organometallic compounds can also sublime onto the tops of the solder bumps.

The amount of the unsaturated cycloaliphatic compound used is sufficient to clean the caps of the solder bumps without etching the metal. If too much is used, the pillars, solder bumps, and/or the Ti or Ti/W glue layer can be etched and pitted.

The unsaturated cycloaliphatic compound can be present in the solution in an amount ranging from at least 1 wt. %, or at least 2 wt. %, or at least 2.5 wt. %, or at least 3 wt. %, or at least 3.5 wt. %, or at least 4 wt. %, and up to 8 wt. %, or up to 7 wt. %, or up to 6.5 wt. %, or up to 6 wt. %, or up to 5.5 wt. %, or up to 5 wt. %, or up to 4.5 wt. %, or up to 4 wt. %.

An example of an unsaturated cycloaliphatic compound can be represented by the following general formula (X):

wherein $R^{14}$ and $R^{15}$ are independently hydrogen, a hydroxyl group, or a branched or unbranched $C_1$-$C_8$ alkyl group having one or more primary or secondary hydroxyl groups, provided that $R^{14}$ and $R^{15}$ are not both hydrogen and are not both hydroxyl groups. Desirably, $R^{14}$ is hydrogen and $R^{15}$ is an unbranched $C_1$-$C_8$ alkyl group, or a $C_1$-$C_8$ alkyl group, or a $C_1$-$C_6$ alkyl group, or a $C_1$-$C_4$ alkyl group, or a $C_1$-$C_2$ alkyl group, each having a primary hydroxyl group.

Examples of the unsaturated cycloaliphatic compound include tetrahydrofurfuryl alcohol, furfuryl alcohol, or a combination thereof.

E. The Organic Base

The solution contains an organic base that contains an amine group. The organic base effectively aids in decomposition reactions and is chemically compatible with and solvates the degradation product residues on the wafer. The organic nature of the base helps solvate the organic residues.

The organic base is desirably a liquid at 25° C. Desirably, the organic base is an alkanolamine compound.

The alkanolamine desirably has at least two carbon atoms, at least one nitrogen atom, and at least one hydroxyl group, the nitrogen atom and hydroxyl group being attached to different carbon atoms.

Examples of alkanolamines include ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol , 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1, 3-diol, ethers of alkanolamines, and combinations thereof.

In an embodiment, the organic base has 2 or fewer hydroxyl groups, a primary hydroxyl group, and 6 or fewer, or 5 or fewer, or 4 or fewer carbon atoms, such as monoethanolamine, N-methylethanolamine, N-ethylethanolamine, N-propylethanolamine, N-butylethanolamine, diethanolamine, methyldiethanolamine, and N-ethyldiethanolamine.

The amount of the organic base in the solution is at least 1 wt. %, or at least 1.5 wt. %, or at least 2 wt. %, or at least 2.5 wt. %, and up to 5 wt. %, or up to 4.5 wt. %, or up to 4.0 wt. %, or up to 3.5 wt. %. An excess can turn the solution turbid and risk the formation of precipitating solids out of solution.

F. The Surfactant

The solution contains a nonionic surfactant that contains at least one ether linkage. The surfactant is effective to prevent precipitation and to keep the solution stable.

In an alternative embodiment, the surfactant has an HLB number of at least 8, or at least 8.2, or at least 8.3, or at least 9, or at least 10, or at least 12, and up to 18, or up to 16, or up to 15, or up to 14, or up to 13.

The surfactant can have a molecular weight of greater than 200, or at least 250, or at least 300, or at least 400, or at least 500, and up to 2000, or up to 1500, or up to 1000, or up to 900, or up to 850, or up to 800, or up to 750, or up to 700, or up to 650, or up to 600, or up to 550, or up to 500, or up to 450.

The surfactant is desirably a liquid at 25° C. and has a viscosity of less than 200 centipoise, or less than 150 cps, or less than 120 cps, or less than 100 cps, or less than 80 cps, or less than 60 cps, or less than 40 cps, or less than 20 cps, or less than 10 cps.

The amount of surfactant should be sufficient to keep a stable solution. The amount of surfactant is at least 1 wt. %, or at least 2 wt. %, or at least 3 wt. %, or at least 3.5 wt. %, or at least 4 wt. %, or at least 4.5 wt. %, and up to 10 wt. %, or up to 8 wt %, or up to 7 wt. %, or up to 6 wt. %.

In an embodiment, the surfactant has an aromatic ring having at least one substituent, said substitutent containing a —$(C_2H_4O)_p$— moiety, where c is an integer ranging from at least 1, or at least 2, or at least 3, or at least 4, or at least 5, or at least 6, or at least 8, or at least 10, and up to 50, or up to 40, or up to 30, or up to 20, or up to 15, or up to 10, or up to 8, or up to 6.

The surfactant may also contain an aromatic ring having a first substituent containing —($C_2H_4O$)— moieties and second substituent comprising a branched or unbranched, saturated or unsaturated, $C_1$-$C_{22}$ alkyl group, or a $C_1$-$C_{12}$ alkyl group, or a $C_1$-$C_{10}$ alkyl group, or a $C_1$-$C_9$ alkyl group, or a $C_1$-$C_7$ alkyl group, or a $C_1$-$C_4$ alkyl group.

The surfactant desirably contains a polyoxyalkylene (EO preferred) derivative of a phenolic compound which can be substituted with an branched or unbranched alkyl group. Phenol ethoxylates are non-ionic surfactants, consisting of a phenol or a branched-chain alkylphenol which has been reacted with ethylene oxide, producing an ethoxylate chain. Commercial formulations are usually a complex mixture of homologues, oligomers and isomers. Examples of common alkylphenols are nonylphenol ethoxylates and octylphenol ethoxylates. Examples of repeating EO units are 4, 6, 7, 8, 9, and 10.

If an alkyl phenolic compound is used to react with EO, suitable examples include cresol, ethylphenol, propylphenol, butylphenol, amylphenol, hexylphenol, heptylphenol, octylphenol, nonyl phenol, decylphenol, dodecylphenol, tetradecylphenol, octadecylphenol, their mixtures or their isomers. Olefins useful in preparation of these alkylphenols may contain odd or even number carbon atoms which may be an advantage in many applications. Mixtures of a-olefins having various ranges of carbon atoms such as C6-C7, C7-C9, C9-Cn, Cn-C15, C15-C20 and higher may be used in the preparation of these alkylphenols. Olefins containing even number carbon atoms such as those derived from fats are also useful. Likewise, the di- and trialkyl substituted derivatives of the aforementioned alkylphenols may be used, such as diisobutylphenol, diamylphenol, dinonylphenol, didodecylphenol, dioetadecylphenol, tri-t-butylphenol, trinonylphenol and the like.

Specific examples of the surfactant include the following compounds, in which EO means ethylene oxide and the number is the number moles of EO reacted with one mole of the phenolic compound: phenol+1 EO or 2 EO or 3E0 or 4 EO or 5 EO or 6 EO or 8 EO or 9 EO or 10 EO, dioetadecylphenol+ 10 EO, phenol+10 EO, o-cresol+20 EO, diisobutylphenol +30E0, nonylphenol+1 EO or 2 EO, or 3 EO or 4 EO or 6 EO, diamylphenol+8 EO, dodecylphenol+20 EO, diamylphenol+ 150 EO, hexylphenol +15 EO, octadecylphenol+20 EO, and nonyl phenol+50 EO.

Additionally, water may be present in the solution. Often, water will be present in the solution as a result of water present in one or more of the additives combined together to make the solution. Desirably, water is not separately added to the solution but can be present in the solution as a result of its presence in an aqueous formulation of an additive other than water or if an additive is hydroscopic and picks up atmospheric moisture. Water may be present in the solution in amount of less than 2 wt %, or less than 1 wt. %, and at least 0.1 wt. %. To reduce the water content of the solution, one can subject the solution to a vacuum and backfill with an inert gas. One can also warm the solution to improve water vaporization.

Examples of formulations include:
A. dialkyl sulfoxides such as dimethylsulfoxide;
B. an alkali metal hydroxide such a potassium hydroxide;
C. one or more glycol ethers such as those represented by one or more of the following formulas:

$$R^8OC_2H_4OC_2H_4OH, \tag{V}$$

$$R^9OC_3H_6OC_3H_6OH, \tag{VI}$$

$$R^{10}OC_2H_4OH, \text{ or} \tag{VII}$$

$$R^{11}OC_3H_6OH, \tag{VIII}$$

wherein $R^4$, $R^{4'}$, $R^5$, $R^{5'}$, $R^6$, $R^7$, $R^8$, $R^9$, $R^{10}$, and $R^{11}$ are independently selected from branched or unbranched $C_1$-$C_{14}$ alkyl groups, or $C_1$ to $C_8$ alkyl groups, and can include ethyleneglycol monomethyl ether, ethyleneglycol monoethyl ether, propylene glycol monomethyl ether, diethylene glycol monomethyl ether, diethylene glycol monoethyl ether, diethylene glycol monopropyl ether, diethylene glycol monobutyl ether, dipropylene glycol monobutyl ether, dipropylene glycol monopropyl ether, ethylene glycol monohexyl ether, ethyleneglycol mono-2-ethylbuyl ether, triethyleneglycol monobutyl ether, tetraethyleneglycol monobutyl ether, or tetrapropyleneglycol monobutyl ether, or combinations thereof;
or
or those represented by formula (IX):

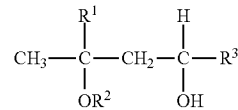

wherein $R^1$ and $R^3$ are each independently be a hydrogen atom or a $C_1$-$C_6$ alkyl group, $R^2$ is a $C_1$-$C_6$ alkyl group, and can include 3-methoxybutanol; 3-methyl-3-methoxybutanol; 3-methyl-1,3-butanediol, or combinations thereof.

D. a compound having a furfuryl moiety and containing primary hydroxyl group such as tetrahydrofurfuryl alcohol; E. an alkanolamine; and
F. a nonionic surfactant obtained by the reaction of a phenol or alkyl phenol with ethylene oxide.

In each of the ingredients A-F, the compounds are different and distinct from each other. In other words, a single compound does serve to constitute two or more of the ingredients A-F.

The amounts of each compound A-F in the solution of the invention can be:
A: at least 73 wt. %, or at least 75 wt. %, or at least 78 wt. %, or at least 80 wt. %, up to 87 wt. %, or up to 85 wt. %; and ranges can include 73-87, or 75-87, or 80-87, each in wt. %;
B. at least 1.0 wt. %, or greater than 1.0 wt. %, or at least 1.1 wt. %, up to 1.6 wt. %, or up to 1.5 wt. %, or 1-1.6, each in wt. %;
C. up to 10 wt. %, or up to 8 wt. %, or up to 7 wt. %, and at least 3 wt. %, or at least 4 wt. %, or 3-10, or 4-8, each in wt. %;
D. at least 2.5 wt. %, or at least 3 wt. %, or at least 3.5 wt. %, up to 6.5 wt. %, or up to 6 wt. %, or up to 5.5 wt. %, or 2.5-6.5, or 3-6, or 3.5-6;
E. at least 2 wt. %, or at least 2.5 wt. %, and up to 5 wt. %, or up to 4.5 wt. %, or up to 4.0 wt. %, 2-5, or 2-4.5, or 2-4, each in wt. %; and
F. at least 2 wt. %, or at least 3 wt. %, or at least 3.5 wt. %, up to 7 wt. %, or up to 6 wt. %, or 2-7 or 3-6, each in wt. %.

There is also provided a method of cleaning semiconductor wafers using the solution of the invention.

In typical processes, the wafer is immersing in a bath of the cleaning solution. Agitation of the composition in the bath additionally facilitates photoresist removal. Agitation can be effected by mechanical stirring, circulating, by bubbling an inert gas through the composition, or any combination thereof. Upon removal of the desired amount of resist and residues, the substrate is removed from contact with the cleaning solution and rinsed with water, an alcohol, or a mixture thereof. DI water is a preferred form of water and isopropanol is a preferred alcohol. Water is the preferred rinsing agent. For substrates having components subject to oxidation, rinsing can be done under an inert atmosphere.

In addition to immersion techniques, wafers can also be contacted with a stripper solution utilizing a spray device with the stripper solution maintained at the desired temperature, or a combination of immersion and spray. The spraying can optionally be carried out using additional cleaning aids including ultrasonics and/or under an inert atmosphere or optionally in the presence of an active gas such as, for example, oxygen or ozone. The wafer can be removed periodically and inspected to determine when sufficient cleaning has occurred. The clean wafer can be rinsed with isopropanol and dried.

Additionally, wafers containing a single layer of negative thick photoresist dry film, or single layer of negative or positive spin on film, and resist stacks having one or multiple layers of positive and/or negative resists can also be processed by these methods. Typical resist stacks can include, but are not limited to, one or multiple layers of resist which can include, for example, a planarizing layer, a bottom antireflection coating layer, a hard mask, and/or a photoresist.

In one process of the invention, there is provided an etched wafer (e.g. by plasma or dilute acid) containing metal pillars, wherein the etched wafer is brought into contact with a cleaning solution and cleaned such that the wafer is substantially free of residues including post etch residues (such as solder bump residues) and photoresist residues without etching the metal pillars. The contact can be via immersion or spray techniques.

In another process according to the present invention, one can:
1. Provide a wafer having a substrate, a cured polyimide layer, a Ti or Ti/W seed layer, a copper seed layer, a photoresist layer, copper pillars, and solder bumps;
2. Remove photoresist from a bumped wafer containing a photoresist;
3. Remove the copper seed layer, such as through a dilute acid etch,
4. Selectively remove the Ti or TiW film on the wafer though a plasma etch or in a dilute acid etch,
5. Plasma etch from about 1 to 1.5 microns of uncured polyamide layer on the wafer, wherein step 4 and 5 can occur simultaneously; and
6. Contact the plasma etched wafer with the solution of the invention to remove all residues.

Once the substrate is submerged in the solution or the solution is applied and covers, or coats, the entire area, the substrate can be heated or the solution can be applied hot, desirably the latter. Operationally, the solution is preferably maintained at a temperature at a temperature under the flash point of the solution when contacted with the substrate wafer. The solution of the invention preferably has a flash point above the operational temperature used to clean the wafer. The solution of the invention can have a flash point that is at least 75° C., or at least 80° C., or at least 85° C., or at least 90° C., and desirably at 80° C. or more, or at least 85° C. or at least 90° C.

The wafer can be in contact with the cleaning solution for a period of from about 10 minutes to 150 minutes, or 45 minutes to 90 minutes. The variability in time is dependent upon the material to be removed, its thickness, and exposure condition.

The rinsing agent used for rinsing can be at a temperature of about 5° C. to about 100° C. However, rinsing can also occur at room temperature.

EXAMPLE 1

Table 1 sets forth cleaning composition formulations used in the following examples.

TABLE 1

| Residue Removal Formulations | | | |
|---|---|---|---|
| [1] | [2] | [3] | [4] |
| DMSO, 84.5% | DMSO, 82% | DMSO, 80.5% | DMSO, 80.5 |
| MEA, 3% | MEA, 4% | MEA, 2.8% | MEA, 2.8% |
| DB, 11% | MMB, 10% | MMB, 10.5% | MMB, 6.7% |
| $H_2O$, 0.3% | $(C_2H_4O)_nC_{18}H_{34}O_3$, 3% | Phenol ethoxylate, 4.7% | Phenol ethoxylate, 4.7% |
| KOH, 1.2% | $H_2O$, 0.2% | $H_2O$, 0.4% | THFA, 3.8% |
| | KOH, 0.8% | KOH, 1.1% | $H_2O$, 0.4% |
| | Ethylsilicate, 0.02% | | KOH, 1.1% |
| [5] | [6] | [7] | [8] |
| DMSO. 80.4% | DMSO, 84.5% | DMSO, 84.5% | DMSO, 84.5% |
| MEA, 2.8% | MEA, 14% | MEA, 3% | MEA, 3% |
| MMB, 10.5% | $H_2O$, 0.3% | DM, 11% | MMB, 7% |
| DM, 1.9% | KOH, 1.2% | $H_2O$, 0.3% | THFA, 4% |
| $(C_2H_4O)_nC_{18}H_{34}O_3$, 3% | | KOH, 1.2 % | $H_2O$, 0.4% |
| $H_2O$, 0.2% | | | KOH, 1.1% |
| KOH, 1.2% | | Ethylsilicate, 0.02% | |

DMSO: dimethyl sulfoxide
MEA: monoethanolamine
MMB: 3-methoxy-3-methylbutanol
DM: diethylene glycol methyl ether
$(C_2H_4O)_nC_{18}H_{34}O_3$: Obtained as Disperbyk 192 rom BYK Chemie
KOH: potassium hydroxide
THFA: tetrahydrofurfuryl alcohol
Phenol Ethoxylate: 4 EO moles nominal

EXAMPLE 1

The components for the formulations tested, [1-8] in the following Examples were combined with stirring at room temperature to give between 100 and 300 g of a homogenous stripper solution. Solution homogeneity requires the KOH to be blended into the appropriate co-solvents prior to addition of DMSO. The surfactant is added into the blend last. The solution was heated to 93° C., with slow agitation for 2 hours. The timer was started when the solution reached the desired temperature. The solution was then removed from the heat source and left to cool to room temperature, 23° C. Observations about solution clarity and amount of precipitate were recorded in Table 2.

EXAMPLE 2

The components for the formulations tested in the following Examples were combined with stirring at room temperature to give between 100 and 300 g of a homogenous stripper solution. Solution homogeneity requires the KOH to be blended into the appropriate co-solvents prior to addition of DMSO. The surfactant is added into the blend last. The solution was heated to 93° C., with slow agitation. Patterned test wafers with solder bumps positioned as an array in a polyimide film were obtained. The test wafers had been processed in a high energy oxidizing plasma to remove about 1-3 µm of polyimide. Residues deposited on the sides and tops of solder bumps during a plasma process were not removed prior to these tests. The patterned test wafers were cleaved into ~4×3 cm pieces and mounted into a small scale wafer holder.

Unless otherwise noted in a Table, each stripper solution was heated to 93° C. and a wafer piece immersed. The timer was started as soon as they were fully immersed. Immersion was maintained 75 minutes, after which the wafer was rinsed with DI water and dried.

Samples were evaluated as clean (C) if substantially all residues had been removed from the tops and sidewalls of the solder pillar and no organic resist pieces re-deposited on any part of the field of the wafer. Samples were evaluated as not clean (NC) if substantially all materials had not been removed. Not clean (NC) does not mean that no cleaning at all had occurred. Results are recorded in Table 2.

In addition to the residues described above, each patterned test wafer had a variety of materials, including copper metal, a tin/silver amalgam, and cured polyimide damaged by an oxidizing plasma. A successful solution must remove the residues while maintaining compatibility with all other materials on the wafer surface. Metal compatibility was concluded based on SEM imaging of the samples. Polyimide compatibility was concluded based on two tests: (1) SEM imaging of samples and if (1) showed compatibility, then (2) comparison of the polyimide FTIR spectrum on blanket PI wafers, exposed to the same plasma treatment as the wafer, prior to immersion and after immersion. Comparison of spectra before and after indicated if any change in chemical composition or thickness, calculated based on spacing of interference fringes, occurred. Results are summarized in Table 2. Where N/A is indicated, the solution is not deemed useful for cleaning because it is not stable, and therefore, no cleaning tests are warranted.

TABLE 2

| Formulation | Example 1 Solution Characteristics | | Example 2 Cleaning Characteristics | Example 2 Sample Compatibility | |
|---|---|---|---|---|---|
| | Clarity | Precipitate | | Metals | Polyimide |
| [1] | Clear | Insignificant | Clean | Compatible | not compatible by SEM |
| [2] | Clear | Insignificant | Clean | Compatible | not compatible by SEM |
| [3] | Clear | Insignificant | Not clean under these test conditions | N/A | N/A |
| [4] | Clear | Insignificant | Clean | Compatible | Compatible by SEM and FTIR |
| [5] | Clear | Insignificant | Clean | Compatible | Not compatible by SEM |

TABLE 2-continued

| Formulation | Example 1 Solution Characteristics | | Example 2 Cleaning Characteristics | Example 2 Sample Compatibility | |
|---|---|---|---|---|---|
| | Clarity | Precipitate | | Metals | Polyimide |
| [6] | Clear | Yes | N/A | N/A | N/A |
| [7] | Clear | Yes | N/A | N/A | N/A |
| [8] | Clear | Yes | N/A | N/A | N/A |

EXAMPLE 3

The components for the formulations tested, [9-25] in the following Examples were combined with stirring at room temperature to give between 300 g of a homogenous stripper solution. Solution homogeneity requires the KOH to be blended into the appropriate co-solvents prior to addition of DMSO. The surfactant is added into the blend last. The solution was heated to 93° C., with slow agitation for 2 hours. 93° C. was selected as an extreme temperature to exacerbate any stability problems that could occur. The timer was started when the solution reached the desired temperature. The solution was then removed from the heat source and left to cool to room temperature, 23° C. Observations about solution clarity and amount of precipitate were recorded in Table 3.

EXAMPLE 4

The components for the formulations tested in the following Examples [9-25] were combined with stirring at room temperature to give between 100 g of a homogenous stripper solution. Solution homogeneity requires the KOH to be blended into the appropriate co-solvents prior to addition of DMSO. The surfactant is added into the blend last. The solution was heated to between 93° C., with slow agitation. Patterned test wafers with solder bumps positioned as an array in a polyimide film were obtained. The test wafers had been processed in a high energy oxidizing plasma to remove about 1-3 µm of polyimide. Residues deposited on the sides and tops of solder bumps during the plasma process were not removed prior to these tests. The patterned test wafers were cleaved into ~4×3 cm pieces and mounted into a small scale wafer holder.

Unless otherwise noted in a Table, each stripper solution was heated to 93° C. and a wafer piece immersed. The timer was started as soon as they were fully immersed. Immersion was maintained 75 minutes, after which the wafer was rinsed with DI water and dried. Results are recorded in Table 3.

In addition to the residues described above, each patterned test wafer had a variety of materials, including copper metal, a tin/silver amalgam, and cured polyimide that had been damaged by the oxidizing plasma. A successful solution must remove the residues while maintaining compatibility with all other materials on the wafer surface. Metal compatibility was concluded based on SEM imaging of the samples. Polyimide compatibility was concluded based on two tests: (1) SEM imaging of samples and if (1) showed compatibility, then (2) comparison of the polyimide FTIR spectrum on blanket PI wafers, exposed to the same plasma treatment as the wafer, prior to immersion and after immersion. Comparison of spectra before and after indicated if any change in chemical composition or thickness, calculated based on spacing of interference fringes, occurred. Results are summarized in Table 3.

TABLE 3

| Formulation | Solution Characteristics | | Cleaning Characteristics | Sample Compatibility | |
|---|---|---|---|---|---|
| | Clarity | Precipitate | | Metals | Polyimide |
| [9] DMSO, 81%; MEA, 2.8; MMB 6.7%; THFA, 3.8%; Phenol ethoxylate, 4.7, KOH, 0.9%, $H_2O$ 0.1% | Clear | Yes | N/A | N/A | N/A |
| [10] DMSO, 80%; MEA, 2.8; MMB 6.7%; THFA, 3.8% Phenol ethoxylate, 4.7; KOH, 1.8%; $H_2O$, 0.2% | Clear | Insignificant | Clean | | |
| [11] DMSO, 79.2%; MEA, 2.8; MMB 6.7%; THFA, 3.8%; Phenol ethoxylate, 4.7; KOH, 2.5%; $H_2O$ 0.3% | Clear | Yes | N/A | N/A | N/A |
| [12] DMSO, 78.2%; MEA, 2.8; MMB 6.7%; THFA 3.8%; Phenol ethoxylate, 7; KOH, 1.2%; $H_2O$ 0.3% | Clear | Insignificant | Clean | Compatible | Compatible using SEM |
| [13] DMSO, 84.2%; MEA, 2.8; MMB 6.7%; THFA 3.8% Phenol ethoxylate, 1; KOH, 1.2%; $H_2O$, 0.3% | Slightly hazy | Insignificant | Not tested but predicted clean, (within boundaries of examined formulation window) | Not tested but predicted compatible | Not tested but predicted compatible |
| [14] DMSO, 78.3%; MEA, 5; MMB 6.7%; THFA, 3.8% Phenol ethoxylate, 4.7; KOH, 1.2%; $H_2O$, 0.3% | Cloudy | Yes | N/A | N/A | N/A |
| [15] DMSO, 73.3%; MEA, 10; MMB 6.7%; THFA, 3.8% Phenol ethoxylate, 4.7; KOH, 1.2%; $H_2O$, 0.3% | Cloudy | Yes | N/A | N/A | N/A |
| [16] DMSO, 78.3%; MEA, 2.8; MMB 6.7%; THFA, 6% Phenol ethoxylate, 4.7; KOH, 1.2%; $H_2O$, 0.3% | Clear | Insignificant | Clean | Compatible | Compatible using SEM |
| [17] DMSO, 76.3%; MEA, 2.8; MMB 6.7%; THFA, 8% Phenol ethoxylate, 4.7; KOH, 1.2%; $H_2O$, 0.3% | Clear | Insignificant | Clean | Compatible | Compatible using SEM |
| [18] DMSO, 84.2%; MEA, 2.8; MMB 3%; THFA, 3.8% Phenol ethoxylate, 4.7; KOH, 1.2%; $H_2O$, 0.3% | Clear | Insignificant | Clean | Compatible | Compatible using SEM |
| [19] DMSO, 79.2%; MEA, 2.8; MMB 8%; THFA, 3.8% Phenol ethoxylate, 4.7; KOH, 1.2%; $H_2O$, 0.3% | Clear | Insignificant | Clean | Compatible | Compatible using SEM |
| [20] DMSO, 77.2%; MEA, 2.8; MMB 10%; THFA, 3.8% Phenol ethoxylate, 4.7; KOH, 1.2%; $H_2O$, 0.3% | Clear | Yes | N/A | N/A | N/A |
| [21] DMSO, 72.2%; MEA, 2.8; MMB 15%; THFA, 3.8% Phenol ethoxylate, 4.7; KOH, 1.2%; $H_2O$, 0.3% | Clear | Yes | N/A | N/A | N/A |
| [22] DMSO, 79.5%; MEA, 2.8; MMB 6.7%; THFA, 3.8%; Phenol ethoxylate, 4.7; KOH, 1.2%; $H_2O$ 1.3% | Clear | Yes | N/A | N/A | N/A |
| [23] DMSO, 77.5%; MEA, 2.8; MMB 6.7%; THFA, 3.8%; Phenol ethoxylate, 4.7; KOH, 1.2%; $H_2O$, 3.3% | Clear | Yes | N/A | N/A | N/A |

TABLE 3-continued

| Formulation | Solution Characteristics | | Cleaning Characteristics | Sample Compatibility | |
|---|---|---|---|---|---|
| | Clarity | Precipitate | | Metals | Polyimide |
| [24]<br>DMSO, 75.5%; MEA, 2.8; MMB 6.7%; THFA, 3.8%<br>Phenol ethoxylate, 4.7; KOH, 1.2%; H$_2$O, 5.3% | Clear | Yes | N/A | N/A | N/A |
| [25]<br>NMP, 80.5%; MEA, 2.8; MMB 6.7%; THFA, 3.8%<br>Phenol ethoxylate, 4.7; KOH, 1.2%; H$_2$O, 0.3% | Hazy | Gelled | N/A | N/A | N/A |

EXAMPLE 5

Formulation [4], Table 1 was tested in the following Examples of cleaning with different immersion processes. The solution was combined with stirring at room temperature to give about 100 g of a homogenous stripper solution. Solution homogeneity requires the KOH to be blended into the appropriate co-solvents prior to addition of DMSO. The surfactant is added into the blend last. The solution was heated to the target temperature, with slow agitation. Patterned test wafers with solder bumps positioned as an array in a polyimide film were obtained. The test wafers had been processed in a high energy oxidizing plasma to remove about 1-3 μm of polyimide. Residues deposited on the sides and tops of solder bumps during the plasma process were not removed prior to these tests. The patterned test wafers were cleaved into ~4×3 cm pieces and mounted into a small scale wafer holder.

The stripper solution was heated between 70° C. and 93° C. and a wafer piece immersed. The timer was started as soon as they were fully immersed. Immersion was maintained 60 or 75 minutes, after which the wafer was rinsed with DI water and dried. Results are recorded in Table 4.

In addition to the residues described above, each patterned test wafer had a variety of materials, including copper metal, a tin/silver amalgam, and cured polyimide that had been damaged by the oxidizing plasma. A successful solution must remove the residues while maintaining compatibility with all other materials on the wafer surface. Metal compatibility was concluded based on SEM imaging of the samples. Polyimide compatibility was concluded based on two tests: (1) SEM imaging of samples and if (1) showed compatibility, then (2) comparison of the polyimide FTIR spectrum on blanket PI wafers, exposed to the same plasma treatment as the wafer, prior to immersion and after immersion. Comparison of spectra before and after indicated if any change in chemical composition or thickness, calculated based on spacing of interference fringes, occurred. Results are summarized in Table 4.

TABLE 4

| Formulation | Process Information | | | Sample Compatibility | |
|---|---|---|---|---|---|
| | Temperature (° C.) | Time (min) | Cleaning Characteristics | Metals | Polyimide |
| [4] | 93 | 75 | Clean | Compatible | Compatible by SEM and FTIR |
| [4] | 80 | 75 | Clean | Compatible | Compatible by SEM and FTIR |
| [4] | 70 | 75 | Not clean under these test conditions | N/A | N/A |
| [4] | 80 | 60 | Clean | Compatible | Compatible by SEM and FTIR |

What we claim is:

1. There is provided a solution comprising:
  A. a polar aprotic solvent,
  B. an inorganic base;
  C. a co-solvent for said inorganic base;
  D. a unsaturated cycloaliphatic compound having a ring ether group and at least one substituent bearing a primary hydroxyl group;
  E. an organic base comprising an amine compound;
  F. a nonionic surfactant bearing at least one ether group; and
  G. water present in an amount less than 2 wt. %.

2. The solution of claim 1, wherein the polar aprotic solvent comprises a $C_1$-$C_4$ dialkyl sulfoxide.

3. The solution of claim 2, wherein the polar aprotic solvent comprises dimethyl sulfoxide.

4. The solution of claim 2, wherein the solution contains less than 8 weight percent pyrrolidone compounds.

5. The solution of claim 4, wherein the solution contains less than 3 weight percent pyrrolidone compounds.

6. The solution of claim 5, wherein the solution contains no added pyrrolidone compounds.

7. The solution of claim 3, wherein dimethyl sulfoxide is present in an amount within a range of 60 wt. % to 90 wt. %.

8. The solution of claim 7, wherein dimethyl sulfoxide is present in an amount within a range of 75 wt. % to 85 wt. %.

9. The solution of claim 1, wherein the polar aprotic solvent is a type present in an amount effective to remove:
  (i) uncured polyimide photoresist from a semiconductor wafer and
  (ii) polyimide polymer residues that have been subjected to a plasma etching process,
at one or more temperatures within a range of 78° C. to 90° C. and within 30 seconds when immersed in the solution.

10. The solution of claim 1, wherein the inorganic base comprises a hydroxide of a Group I or Group II metal.

11. The solution of claim 10, wherein the inorganic base comprises a hydroxide of a Group I metal.

12. The solution of claim 11, wherein the inorganic base comprises potassium hydroxide.

13. The solution of claim 1, wherein the solution does not precipitate solids containing the metal of the inorganic base upon heating to 93° C. and within a 4 hour cool down period in ambient conditions.

14. The solution of claim 1, wherein the inorganic base comprises potassium hydroxide present in an amount of at least 1.0 wt. % up to 2.5 wt. %.

15. The solution of claim 14, wherein the inorganic base comprises potassium hydroxide in an amount greater than 1.0 wt. % up to 2.0 wt. %.

16. The solution of claim 1, wherein the inorganic base comprises a compound that reacts with a polyimide polymer on a semiconductor wafer within 30 seconds at one or more temperatures within a range of 78° C. to 90° C.

17. The solution of claim 1, wherein the solution does not contain added lithium hydroxide.

18. The solution of claim 1, wherein the co-solvent comprises a compound that solvates said inorganic base in the polar aprotic solvent.

19. The solution of claim 1, wherein the co-solvent comprises a glycol ether compound having at least one ether group and at least one hydroxyl group.

20. The solution of claim 19, wherein the glycol ether has a molecular weight of less than 200.

21. The solution of claim 20, wherein the glycol ether has a molecular weight of less than 150.

22. The solution of claim 1, wherein the co-solvent comprises a glycol ether having one ether group and one hydroxyl group.

23. The solution of claim 22, wherein the co-solvent is represented by a compound having a structure comprising:

R4'—CO2C2H4OC2H4—OR4, (II)

R5'—CO2C3H6OC3H6—OR5 (III)

R6OCO2R7 (IV)

R8OC2H4OC2H4OH, (V)

R9OC3H6OC3H6OH, (VI)

R10OC2H4OH, or (VII)

R11OC3H6OH, (VIII)

wherein R4, R4', R5, R5', R6, R7, R8, R9, R10, and R11 are independently selected from C1-C14-alkyl groups; wherein R and R1 may be selected from C1 to C8 alkyl groups, but with the provision that both R and R1 cannot represent a methyl group.

24. The solution of claim 1, wherein the co-solvent comprises ethyleneglycol monomethyl ether, ethyleneglycol monoethyl ether, propylene glycol monomethyl ether, diethylene glycol monomethyl ether, diethylene glycol monoethyl ether, diethylene glycol monopropyl ether, diethylene glycol monobutyl ether, dipropylene glycol monobutyl ether, dipropylene glycol monopropyl ether, tripropylene glycol monomethyl ether, tripropylene glycol monobutyl ether, propyleneglycol butyl ether, ethylene glycol monohexyl ether, ethyleneglycol mono-2-ethylbuyl ether, triethyleneglycol monobutyl ether, tetraethyleneglycol monobutyl ether, or tetrapropyleneglycol monobutyl ether.

25. The solution of claim 1, wherein the co-solvent comprises a compound represented by the following formula (IX):

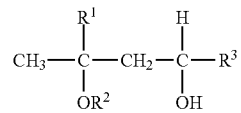

wherein R1 and R3 are each independently a hydrogen atom or a C1-C4 alkyl group, and R2 is a C1-C4 alkyl group.

26. The solution of claim 1, wherein the co-solvent comprises 3-methoxybutanol; 3-methyl-3-methoxybutanol; or 3-methyl-1,3-butanediol.

27. The solution of claim 1, wherein the co-solvent comprises 3-methyl-3-methoxybutanol, 3-methoxybutanol, or a combination thereof.

28. The solution of claim 1, wherein the co-solvent comprises a compound represented by the following general formula (I):

R12O(C2H4)m(C3H6O)nR13 wherein R12 and R13 each individually are a hydrogen atom or an alkyl group having 1-8 carbon atoms, provided that R12 and R13 are not both hydrogen atoms, m and n stand individually for an integer of 0-10 provided that m plus n does not equal zero.

29. The solution of claim 1, wherein the co-solvent is present in the solution in an amount of up to 15 wt. %.

30. The solution of claim 29, wherein the co-solvent is present in the solution in an amount of at least 4 wt. % and up to 8 wt. %.

31. The solution of claim 1, wherein said unsaturated cycloaliphatic compound comprises a compound represented by the following general formula (X):

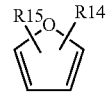

wherein R14 and R15 are independently hydrogen, a hydroxyl group, or a C1-C8 alkyl group having one or more primary or secondary hydroxyl groups, provided that R14 and R15 are not both hydrogen and are not both hydroxyl groups.

32. The solution of claim 1, wherein said unsaturated cycloaliphatic compound comprises tetrahydrofurfuryl alcohol, furfuryl alcohol, or a combination thereof.

33. The solution of claim 1, wherein said unsaturated cycloaliphatic compound is effective to remove residues on the tops of solder bumps on a semiconductor wafer subjected to plasma etching.

34. The solution of claim 1, wherein the unsaturated cycloaliphatic compound is present in the solution in an amount ranging from 1 wt. % to 8 wt. %.

35. The solution of claim 1 comprising
A. dimethyl sulfoxide,
B. potassium hydroxide,
C. a co-solvent represented by the following formula (IX):

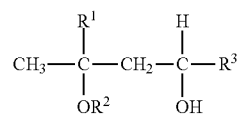

wherein R1 and R3 are each independently be a hydrogen atom or a C1-C4 alkyl group, and R2 is a C1-C4 alkyl group, D. a cycloaliphatic compound having a furfuryl moiety, E. an alkanolamine, F. a polyoxyethylene of phenol or an alkylphenol.

36. The solution of claim 1, wherein the unsaturated cycloaliphatic compound is present in the solution in an amount ranging from 2 wt. % to 5 wt. %.

37. The solution of claim 1, wherein the organic base comprises an alkanolamine.

38. The solution of claim 37, wherein the alkanolamine has at least two carbon atoms, at least one nitrogen atom, and at least one hydroxyl group, the nitrogen atom and hydroxyl group being attached to different carbon atoms.

39. The solution of claim 1, wherein the organic base comprises ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol 1-aminopropane-2,3-diol, 2-aminopropane-1, 3-diol tris(oxymethyl)aminomethane, 2-(2-aminoethoxy)ethanol, or ethers of alkanolamines.

40. The solution of claim 1, wherein the organic base comprises ethanolamine, N-methylethanolamine, N-ethylethanolamine, N-propylethanolamine, diethanolamine, triethanolamine, N-methyldiethanolamine, N-ethyldiethanolamine, isopropanolamine, or diisopropanolamine.

41. The solution of claim 1, wherein the organic base comprises N-methylethanolamine.

42. The solution of claim 1, wherein the organic base is present in an amount ranging from 1 wt. % to 5 wt. %.

43. The solution of claim 1, wherein the organic base is present in an amount ranging from 1.5 wt. % to 4 wt. %.

44. The solution of claim 1, wherein the organic base comprises an alkanolamine that is liquid at 25° C.

45. The solution of claim 1, wherein the nonionic surfactant has an HLB number of at least 8.

46. The solution of claim 1, wherein the surfactant has a molecular weight of greater than 200 and less than 1000.

47. The solution of claim 1, wherein the surfactant is a liquid and has a viscosity of less than 200 cps at 25° C.

48. The solution of claim 1, wherein the surfactant has a viscosity of less than 100 centipoise at 25° C.

49. The solution of claim 1, wherein the amount of surfactant is at least 1 wt. % and up to 10 wt. %.

50. The solution of claim 1, wherein the surfactant has a molecular weight of less than 800.

51. The solution of claim 1, wherein the surfactant comprises an aromatic ring having at least one substituent, said substituent containing —(C2H4O)— moieties.

52. The solution of claim 1, wherein the surfactant comprises a compound having a phenolic ethoxylate moiety.

53. The solution of claim 1, wherein the surfactant comprises an aromatic ring having at least one substituent, said substituent containing —(C2H4O)$_p$— moieties, wherein p is an integer within a range of 1 to 40.

54. The solution of claim 1, wherein the surfactant comprises an aromatic ring having at least one substituent, said substituent containing —(C2H4O)$_p$— moieties, wherein p is an integer within a range of 2 to 8.

55. The solution of claim 1, wherein the surfactant comprises an aromatic ring having a first substituent containing —(C2H4O)— moieties and a second substituent comprising a branched or unbranched, saturated or unsaturated, $C_1$-$C_{22}$ alkyl group.

* * * * *